(12) United States Patent
Moon

(10) Patent No.: US 7,709,825 B2
(45) Date of Patent: May 4, 2010

(54) ELECTRICALLY PROGRAMMABLE HYPER-SPECTRAL FOCAL-PLANE-ARRAY

(75) Inventor: Jeong-Sun Moon, Moorpark, CA (US)

(73) Assignee: HRL Laboratories, L.L.C., Malibu, CA (US)

( * ) Notice: Subject to any disclaimer, the term of this patent is extended or adjusted under 35 U.S.C. 154(b) by 0 days.

(21) Appl. No.: 12/422,032

(22) Filed: Apr. 10, 2009

(65) Prior Publication Data
US 2009/0224138 A1 Sep. 10, 2009

Related U.S. Application Data

(62) Division of application No. 11/522,091, filed on Sep. 14, 2006, now Pat. No. 7,601,981.

(51) Int. Cl.
*H01L 31/00* (2006.01)

(52) U.S. Cl. .......................... 257/21; 250/216; 438/57; 257/30; 257/E31.001

(58) Field of Classification Search ................... 257/21, 257/30; 250/200, 206, 207, 214 R, 214.1, 250/216; 438/57
See application file for complete search history.

(56) References Cited

U.S. PATENT DOCUMENTS

| 6,130,466 A | 10/2000 | Schneider et al. ............ 257/440 |
| 6,495,830 B1 | 12/2002 | Martin ................... 250/339.02 |
| 6,642,537 B1 | 11/2003 | Gunapala ..................... 257/21 |
| 2003/0062560 A1 | 4/2003 | Fisher et al. ................. 257/299 |
| 2004/0178421 A1 | 9/2004 | Kuan et al. .................. 257/186 |

*Primary Examiner*—Bradley K Smith
*Assistant Examiner*—Jami M Valentine

(57) ABSTRACT

A voltage supply is connected to provide a variable bias voltage to a plurality of optical quantum tunneling photodetectors to thereby vary the spectral response of the photodetectors and thus detect radiation.

4 Claims, 3 Drawing Sheets

ELECTRICALLY PROGRAMMABLE HYPER-SPECTRAL FOCAL-PLANE-ARRAY

CROSS-REFERENCE TO RELATED APPLICATIONS

This application is a division of U.S. patent application Ser. No. 11/522,091, filed on Sep. 14, 2006, the disclosure of which is incorporated herein by reference.

TECHNICAL FIELD

This disclosure relates to Focal Plane Array (FPA) technology and more particularly to a new operating concept for hyper-spectral Imaging FPAs offering improved wavelength and time agility.

BACKGROUND

Focal plane arrays (FPAs) refer generally to a class of detectors that have more than one row of detectors and one line of detectors. There are many types of FPAs, and examples include avalanche, industrial, high speed, adaptive, and infrared FPAs. A linear array is a row of individual detectors similar to those found in a facsimile machine or a document scanner. Adaptive FPAs (AFPA) are high-performance FPAs that are widely tunable across the relevant wavebands in, e.g., the infrared (IR) spectrum and enable multispectral imaging. An adaptive focal plane array includes short-wave infrared (SWIR), mid-wave infrared (MWIR), and long-wave infrared (LWIR) bands. An infrared FPA consists of a number of IR sensors held together. An industrial focal plane array includes special features such as low-light levels, anti-blooming/integration control, correlated double sampling, and extended blue response.

There are several ways in which FPAs function. An FPA is typically constructed with on-chip signal processing and contained within the space of the detector area. Scintillating fiberoptic cathode and anode plates can be used to detect gamma-produced electrons. Modern IR FPAs are based on indium gallium arsenide (InGaAs) technology. A high speed focal plane array provides excellent performance at high-speed and low-light levels. An FPA can be specified according to its size and area. Focal plane arrays can be designed and manufactured according to various industry specifications.

Focal plane arrays are used in many applications. Examples include astronomical imaging, aerial reconnaissance, aerial mapping, spectrographic analysis, star tracking, missile seekers, dental and medical radiography, machine vision, x-ray diffraction, and other state-of-the art military, industrial, and scientific measurement applications. For instance, Moderate Resolution Imaging Spectroradiometer (MODIS) deployed in NASA's Earth Observing System (EOS) a decade ago had 36 spectral bands over 0.4-14.4 pm wavelength. Current state of the art hyper-spectral radiometers being developed employ either Fourier Transform Spectrometers (FTS) or Push-broom radiometers in combination with optical filters, offering over 100 spectral bands. However, they can be complex, expensive, and power-hungry. Conversely, achieving multi- or hyper-spectral 2-dimensional starring FPAs has been extremely challenging; current state of the art FPAs are limited to no more than three colors, using either HgCdTe photodetectors or Quantum Well Infrared photodetectors (QWIPs). A vertical integration of wavelength-selective QWIPs or HgCdTe detectors in a 3D cube configuration could enhance its spectral response to multicolor. However, challenges exist in material growth capability, spectral resolution at pixel, and also Read-Out circuitry and state of the art power dissipation. Importantly, none of the current SOA imagers/FPAs offer the functionality for continuously tuning or programming at the pixel levels, which could be important for imaging.

What is now needed are improved methods and apparatus for FPA imaging that offer improved performance in changing environments. The embodiments of the present disclosure answer these and other needs.

SUMMARY

In a first embodiment disclosed herein, a photodetector device comprises a plurality of optical quantum tunneling photodetectors, and at least one voltage supply connected to provide a variable bias voltage to the plurality of photodetectors to thereby vary the spectral response of the photodetectors.

In another embodiment disclosed herein, a photodetector device comprises a plurality of optical quantum tunneling photodetectors, and a plurality of voltage supplies, each connected to provide a variable bias voltage to a respective subset of the plurality of photodetectors and thereby vary the spectral response of the respective photodetectors.

In a further embodiment disclosed herein, a method of detecting radiation comprises selecting a plurality of optical quantum tunneling photodetectors, connecting a variable voltage supply to provide a variable bias voltage to the plurality of photodetectors, varying the bias voltage to the photodetectors to vary the spectral response of the respective photodetectors, and detecting a photocurrent emitted by the plurality of photodetectors. In a different embodiment, an image may be formed by integrating the photocurrent thus detected over a varying bias voltage.

In still further embodiments disclosed herein, an integrator circuit may be connected to selectively integrate a photocurrent emitted by each of the photodetectors. The integrator circuit may be connected to selectively integrate a photocurrent emitted by each of the photodetectors over a varying bias voltage.

These and other features and advantages will become further apparent from the detailed description and accompanying figures that follow. In the figures and description, numerals indicate the various features, like numerals referring to like features throughout both the drawings and the description.

DETAILED DESCRIPTION

"Quantum tunneling" is generally used to describe the phenomenon where electrons cross a dielectric boundary based on a probability model, despite the fact that theoretically electrical current should not flow through the insulator. The quantum tunneling effect has been put to advantageous use in a number of electronic components, including transistor devices. Such quantum tunneling transistors are operated at a voltage sufficient to cause tunneling, but below a voltage which causes breakdown of the dielectric. Quantum tunneling transistors also exhibit properties that are particularly well suited for use in moderate to high speed applications, including low on-resistance and exceptionally fast switching speeds. A new and exciting development is the realization that light can be used to control the gate or base input of the transistor—that is, using photons to initiate tunneling.

The O-TCT, an optical quantum tunneling transistor, is based on the photonic switching of unipolar carriers through inter-quantum-well inter-subband tunneling. Unlike conventional photonic switches/detectors, the detection wavelength of the O-TCT can be selected by the external gate voltage. Thus, sweeping the gate voltage leads to continuous wavelength-tunable detection, similar to that afforded by a spectrometer. This occurs because incident photons generate a photocurrent proportional to the light intensity but only when the incident wavelength matches with the energy gap set by the external gate voltage, because tunneling through the interlayer requires external optical transduction to conserve energy and momentum. Therefore, setting or sweeping the gate voltage differently shifts or tunes the detection wavelength and enables so called 'wavelength binning' the detector with a high spectral resolution and also with a broad spectral tuning capability ranging from THz to IR.

Figure 1:
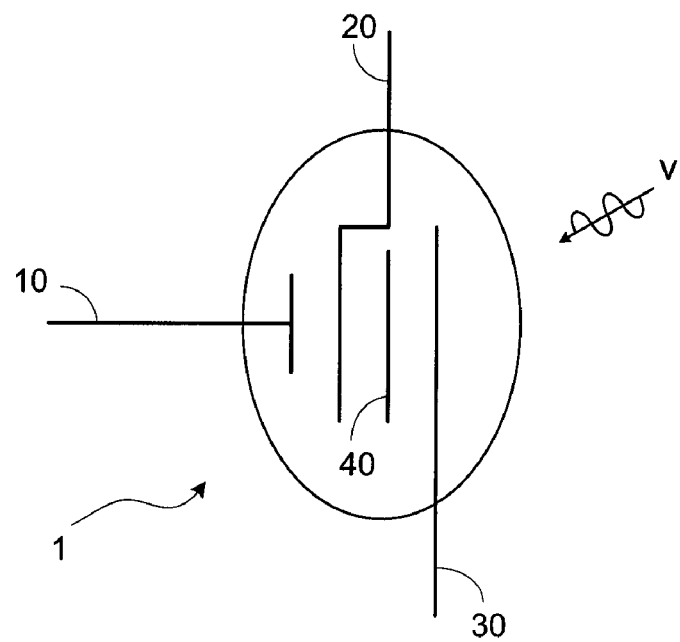
FIG. 1 is a symbolic depiction of an optical quantum tunneling transistor that may be used according to the present disclosure.
Figure 2:
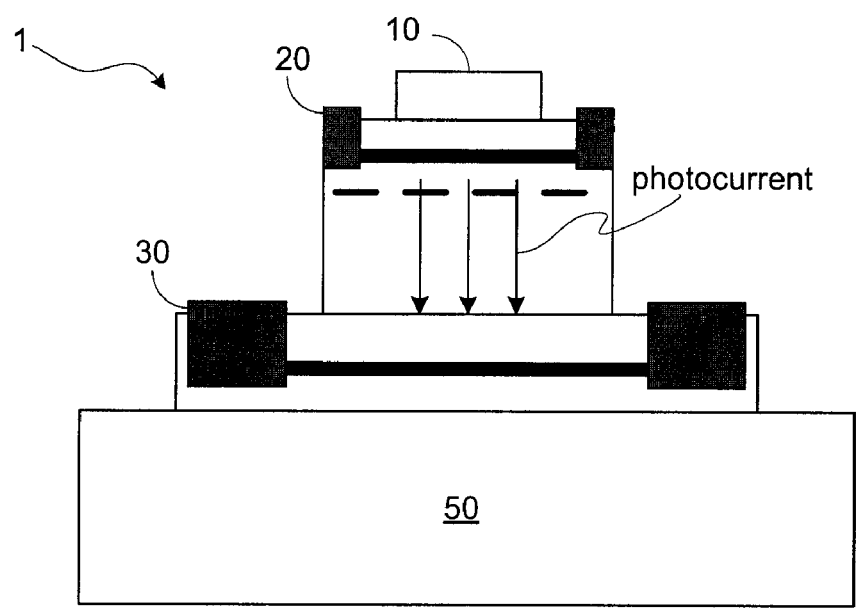
FIG. 2 is schematic diagram of the structure of a optical quantum tunneling transistor that may be used according to the present disclosure.
Figure 3:
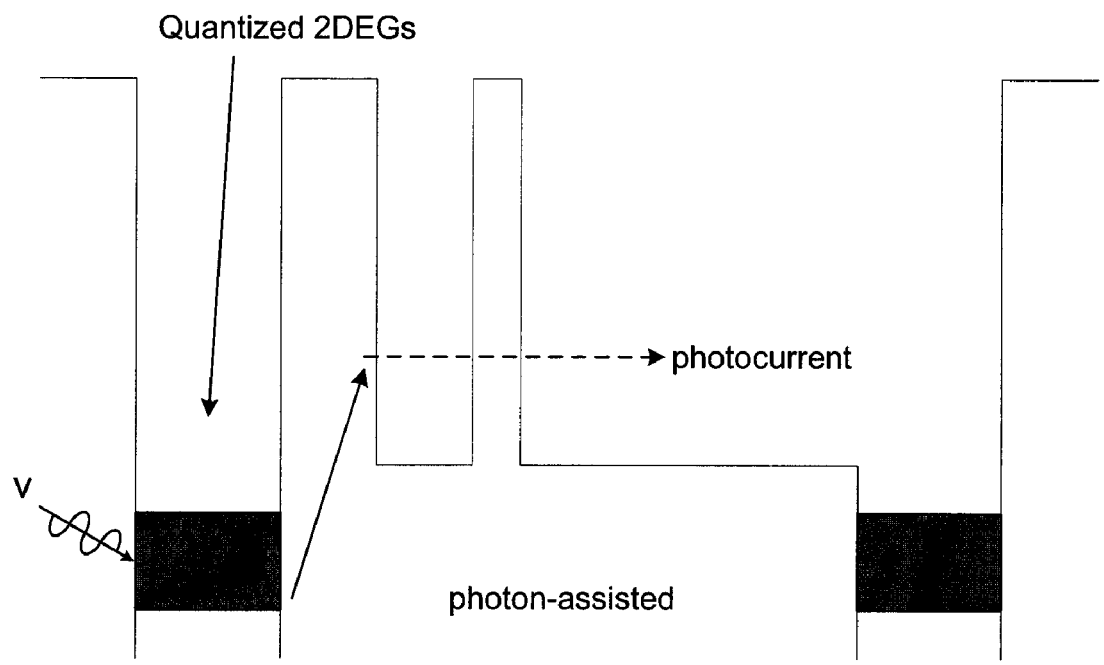
FIG. 3 is a depiction of the energy band diagram of a baseline optical quantum tunneling transistor that may be used according to the present disclosure.
Figure 4:
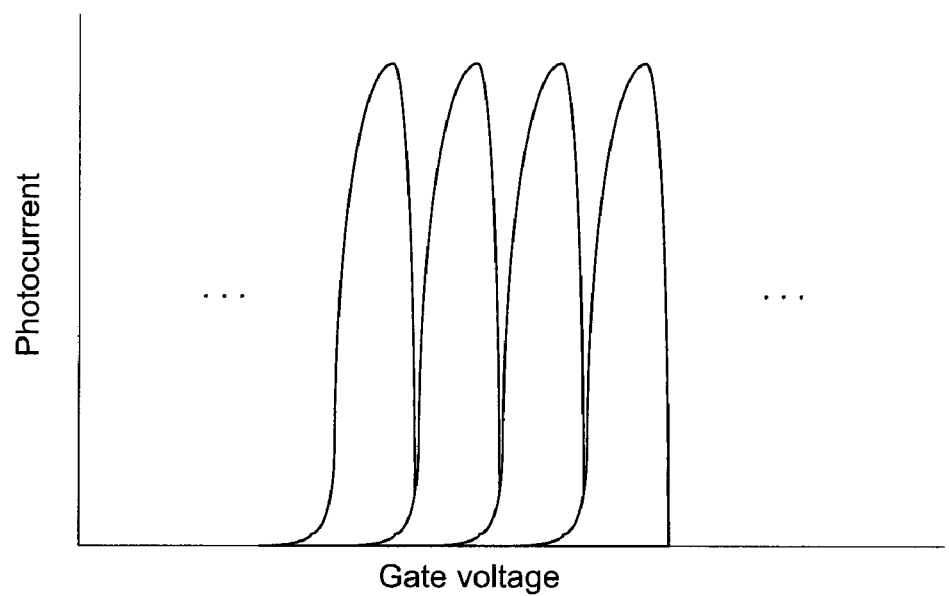
FIG. 4 is a depiction of the anticipated spectral response of an optical quantum tunneling transistor having the energy band diagram of FIG. 3.

With reference now to FIGS. 1 and 2, a schematic layout depicts an O-TCT, and FIGS. 3 and 4 illustrate its operating principles. An O-TCT will include, typically, a tuning gate 10, an emitter 20, and a collector 30. Since O-TCTs are intended to be fabricated in a low dimensional (i.e. not three-dimension) configuration, allowed energy states of the 2DEGs (FIG. 3) in the quantum wells (QW) are quantized (discrete energy states rather than a continuum of energy states). For instance, in O-TCTs, the photon-receiving 2DEG layer has carrier densities of n1 with quantized subband energy of ElO. The excited states by photon-assisted interwell tunneling (PAIT—depicted as 40 in FIG. 1) are not occupied with quantized subband energy of EmO. Assuming EmO>ElO, n1*D where D is a 2DEG density of state, there exists a finite interlayer tunneling gap Δ=EmO−ElO−n1*D due to the two-dimensional nature of the device. Under these conditions, there is no population inversion and O-TCTs are nominally at off-states in the dark (i.e. no light impinging thereon), and no current flows between the electrical contacts 20, 30 (FIGS. 1 and 2) and no standby power dissipation occurs.

When the incoming photon ν wavelength λ is matched with the energy gap Δ, O-TCTs are switched on and a photocurrent flows between the contacts 20, 30. Since the energy gap depends on the overall density n1*D and the carrier density n1 can be controlled by the gate voltage Vg, the energy gap is 'soft', i.e., tunable by the gate voltage, unlike fixed photonic gaps that are determined by material properties. When the applied gate voltage becomes more negative, the carrier density n1 is reduced and so does the 'soft' energy gap. The detection wavelength λ will thus be shifted towards longer wavelengths. Because the electric gate voltage Vg can be continuously scanned, the detection wavelength can also be continuously scanned and thus a hyper-spectral imaging FPA becomes possible. Therefore, unlike conventional optical filter based FPAs, O-TCT based FPAs offer an optical pixel technology with built-in spectral discrimination capability that is simply set by the gate voltage Vg. It is expected that the spectral width (FWHM) will be determined by the quality of wafers utilized or by scattering. Because the detection intensity can be greatly reduced outside of the peak detection wavelength due to the tunneling nature of the device, O-TCTs are further expected to offer hyper-spectral imaging FPA with high resolution.

Figure 5:
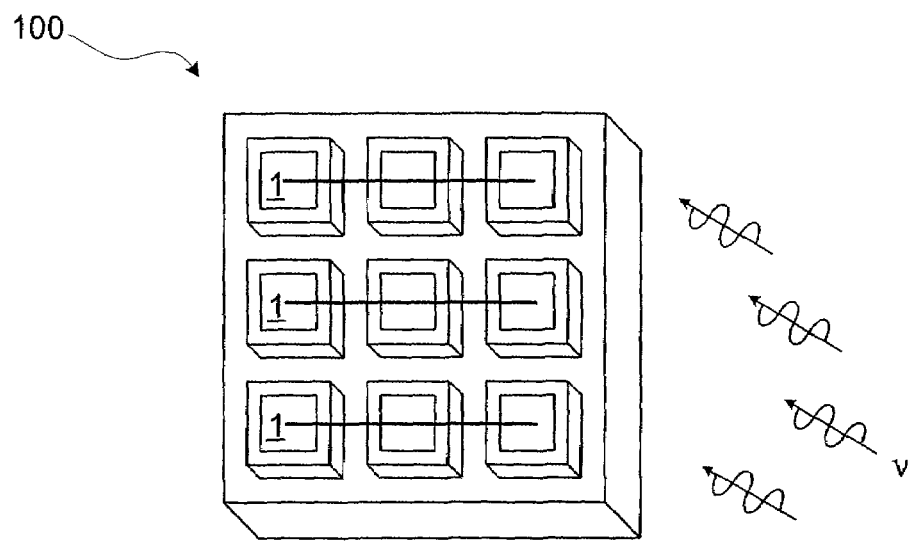
FIG. 5 is a schematic diagram of a focal plane array employing optical quantum tunneling transistors according to the present disclosure.
Figure 6:
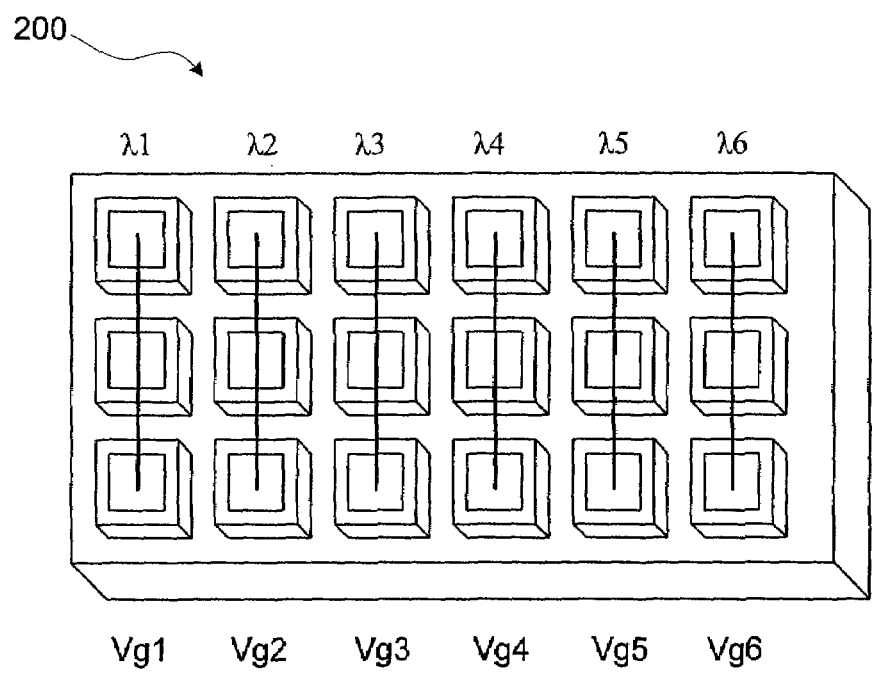
FIG. 6 is a depiction of the FPA of FIG. 5 in operation according to the present disclosure.

With reference to FIG. 5 now, a schematic diagram of a FPA 100 employing optical quantum tunneling transistors 1 is depicted. Pixel size and spacing can be readily engineered to meet optimum spatial resolution, responsivity, and filling factors for detection wavelength band interested in. Extension of this schematic to larger arrays (512×512 for instance) is within the general knowledge of those skilled in the art. Each pixel consists of a single O-TCT 1. In dark, almost no standby power dissipation will occur, enabling extremely power efficient FPAs. The incident light ν can be, for instance, illuminated from the backside. Unlike diode detectors such as QWIP, because there are no heavily doped contacts in line with the light propagation, no free-carrier absorption will occur and the light can be well focused with lithographically patterned optically-transparent metal gratings/antennas, microlenses, or dielectric prisms if necessary. With the light illumination and the wavelength tuning-gate set to a fixed voltage, O-TCT-based FPAs will capture X-Y images at the detection wavelength set by the gate voltage Vg. Of course, the spectral response of such FPAs may be calibrated prior to the actual imaging process. Once the O-TCT FPA captures an image with a gate-voltage specific wavelength (λ1), the gate voltage can be adjusted to a different value and the FPA can recapture the image with a new wavelength (λ2). Given that the gate tuning speed is in the GHz range, the major limiting factor in frame capture is expected to be integration, read-out, and processing times at the back-end of the FPA. Due to the tuning flexibility, O-TCT FPAs can also be operated to detect many different spectra simultaneously either by assigning a different tuning gate voltage Vg at each row in the FPA or by time-division multiplexing through an integration capacitor or trans impedance amplifier.

In light of the preceding, those skilled in the art will appreciate that the hyper-spectral imaging FPA technology disclosed herein offers both wavelength agile and time-agile 2-dimensional focal-plane imaging. Due to the facile re-configurability of the imaging pixels, 2D mapping of images can be adjusted with a highly simplistic architecture that does not require any moving optical parts or filters. The FPAs disclosed herein can be operated either in simultaneous spectral acquisition or in time-interleaved spectral acquisition modes with high spatial resolution.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A method of detecting radiation, comprising:

connecting a variable voltage supply to provide a variable bias voltage to a plurality of optical quantum tunneling photodetectors of the type having a voltage-dependent continuously variable tunneling energy gap;

varying the bias voltage provided by the voltage supply to the photodetectors to vary the spectral response of the respective photodetectors; and detecting a photocurrent emitted by the plurality of photodetectors.

2. The method of claim 1, further comprising:

arranging the detectors in an array of lines;

connecting a respective variable voltage supply to provide a variable bias voltage to each respective line of photodetectors; and varying the bias voltage to each line of photodetectors to vary the spectral response of the respective photodetectors.

3. A method of acquiring an image, comprising:

integrating the photocurrent detected by the method of claim 1 over a varying bias voltage.

4. A method of acquiring an image, comprising:

integrating the photocurrent detected by the method of claim 2 over a varying bias voltage for each line of photodetectors.

* * * * *